(12) United States Patent
Sanders

(10) Patent No.: US 7,613,214 B2
(45) Date of Patent: Nov. 3, 2009

(54) MULTI-WAVELENGTH MODE LOCKED LASER

(75) Inventor: Scott Thomas Sanders, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 154 days.

(21) Appl. No.: 11/749,553

(22) Filed: May 16, 2007

(65) Prior Publication Data

US 2008/0285037 A1    Nov. 20, 2008

(51) Int. Cl.
*H01S 3/098* (2006.01)

(52) U.S. Cl. .............................. 372/18; 372/23; 372/26

(58) Field of Classification Search ............... 372/18, 372/26
See application file for complete search history.

(56) References Cited

FOREIGN PATENT DOCUMENTS

WO    WO 99/39411    8/1999

OTHER PUBLICATIONS

Deparis et al. (IDS NPL: Round-trip times and dispersion optimization in a dual-wavelength actively mode-locked Er-doped fiber laser including nonchirped fiber Bragg gratings; IEEE Photonics Technology letter, Oct. 1999).*

Shenping Li and K.T. Chan, Electrical Wavelength Tunable and Multiwavelength Actively Mode-Locked Fiber Ring Laser, Apr. 20, 1998, pp. 1954-1956, Vo. 72, No. 16, Applied Physics Letters, Woodbury, NY.

Kraetschmer T et al: "Multiwavelength Frequency-Division-Mulitplexed Light Source Based on Dispersion-Mode-Locking"; IEEE Photonics Technology Letters; Piscataway, NJ; vol. 19., No. 20; Oct. 15, 2007; pp. 1607-1609.

Shenping Li et al: "Electrical Wavelength Switching of Modelocked Er-doped Fiber Ring Laser with Two Fiber Gratings"; CLEO '97, Baltimore, MD; May 18, 1997, vol. 11, pp. 473-474.

Zhichao Deng et al: "Dual-wavelength passively mode-locked fiber ring laser"; Electrical and Computer Engineering, 2004. IEEE May 2, 2004, pp. 849-852, vol. 2; Piscataway, NY.

Deparis O et al: "Round-Trip Time and Dispersion Optimization in a Dual-Wavelength Actively Mode-Locked Er-Doped Fiber Laser Including Nonchirped Fiber Bragg Gratings"; IEEE Photonics Technology Letters, vol. 11, No. 10: Oct. 1, 1999.

Shenping Li et al: "Electrical Wavelength-Tunable Actively Mode-Locked Fiber Ring Laser with a Linearly Chirped Fiber Bragg Grating", IEEE Photonics Technology Letters, Piscataway, NJ: vol. 10, No. 6, Jun. 1, 1998.

* cited by examiner

*Primary Examiner*—Dung T Nguyen
(74) *Attorney, Agent, or Firm*—Boyle Fredrickson, S.C.

(57) ABSTRACT

A mode-locked laser employs a light-wavelength-dependent, path-length adjuster to provide different path-lengths for multiple light frequencies and dual modulation frequencies selecting multiple modes with different wavelengths. The result is a single cavity laser producing mode-locked light outputs at defined different frequencies. Tuning of each frequency may be obtained by changing the laser modulation frequencies.

18 Claims, 2 Drawing Sheets

MULTI-WAVELENGTH MODE LOCKED LASER

STATEMENT REGARDING FEDERALLY SPONSORED RESEARCH OR DEVELOPMENT

This invention was made with United States government support awarded by the following agency:
NSF 0238633
The United States government has certain rights in this invention.

BACKGROUND OF THE INVENTION

The present invention relates to lasers and in particular to a mode-locked laser providing multiple coincident beams of discrete different frequencies.

Many important applications for lasers require multiple laser beams having specific wavelengths. For example, U.S. Pat. No. 5,912,178 entitled: "Passive Measurement of Isotopes to Monitor Health", assigned to the assignee of the present invention and hereby incorporated by reference, describes a system for monitoring the ratio of $C_{12}$ to $C_{13}$ in a patient's breath to establish the health of the patient. In this application, a first laser may provide a beam having a wavelength aligned with the $C_{12}$ feature and a second laser may provide a beam having a wavelength aligned with the $C_{13}$ feature. In addition, a third laser may provide a beam having an intermediate wavelength with negligible absorption by $CO_2$ as a baseline reference.

In order to detect absorption of the laser light separately for each of these features, multiple optical paths and detectors may be used, or the laser is separated optically using filters or the like. The need for multiple lasers and associated optical components increases the cost and size of such systems.

SUMMARY OF THE INVENTION

The present inventor has determined that a mode-locked laser can produce multiple discrete beams of light with different wavelengths from a single cavity when simultaneously mode-locked at multiple different frequencies. A laser for this purpose may provide a cavity path-length dependent on light wavelength thereby supporting modes at different light-wavelengths. Modulation of an optical amplifier at multiple periods reinforces only modes having round trip transit times consistent with those periods. Together these elements promote modes producing multiple, narrow bandwidth pulses of light output by the laser. Adjustment of the periods of the modulating signals may be used to control the precise wavelength of the pulse's output. The repetition rate of the pulses of light, also a function of the period of the modulating signals, effectively tags the pulses allowing them to be individually analyzed.

Specifically then, the invention provides a mode-locked laser having a laser cavity with a length defined by the wavelength of light passing through it. An optical amplifier or other modulator positioned within the cavity amplifies light passing in the cavity as controlled by an amplifier input. At least two signal generators produce output signals combined to provide the amplifier input. The output signals have different periods corresponding (for example, as a harmonic) to different round-trip transit times of light of desired frequencies within the laser cavity.

Thus it is one feature of at least one embodiment of the invention to provide multiple discrete wavelength beams from a single laser cavity that are modulated to allow them to be separately analyzed.

The light-wavelength-dependent, path-length adjuster may be a fiber Bragg grating associated with each of the first and second desired wavelengths and selectively reflecting the light of the first and second desired wavelengths at different positions along the optical fiber.

Thus it is a feature of at least one embodiment of the invention to provide a simple light-wavelength-dependent, path-length generator that may be used with optical fibers. It is a further feature of at least one embodiment of the invention to provide an extremely short laser cavity with a concomitant fast response time.

The light-wavelength-dependent, path-length adjuster may be a chirped fiber Bragg filter.

It is thus a feature of at least one embodiment of the invention to provide a single light-wavelength-dependent, path-length adjuster that accommodates a range of light wavelengths.

The invention may further include a tuning means for changing the period of at least one of the output signals to change the wavelength of the light output from the mode-locked laser.

It is thus a feature of at least one embodiment of the invention to allow precise tuning of the output laser beams.

The invention may use at least two chirped fiber Bragg filters positioned at different positions along the optical fiber.

It is thus a feature of at least one embodiment of the invention to provide for both tuning of the output laser beams and arbitrary center frequencies of the laser beams by employing separate chirped fiber Bragg or similar filters The invention may include an optical sensor receiving the beams from the mode-locked laser to provide a light amplitude signal measuring the combined amplitude of the light of the first and second desired wavelengths, and a demodulator extracting an independent amplitude value for each of the first and second wavelengths from the light amplitude signal.

It is thus a feature of at least one embodiment of the invention to provide for separate measurements of the multiple wavelengths of light without the need for isolated optical paths or additional optical components such as filters, interferometers or the like.

The demodulator may be a Fourier transform device.

It is thus a feature of at least one embodiment of the invention to provide a demodulation technique that can be performed for an arbitrary number of different light wavelengths with synchronization with the laser.

The invention may further include a gas-holding chamber positioned in a path of light from the mode-locked laser and before the optical sensor; and the first and second light wavelengths may be centered on first and second absorption bands for gaseous chemical species.

It is thus a feature of at least one embodiment of the invention to provide for more compact rugged and inexpensive gaseous analysis detection systems.

These particular features and advantages may apply to only some embodiments falling within the claims and thus do not define the scope of the invention.

DETAILED DESCRIPTION OF THE PREFERRED EMBODIMENT

Figure 1:
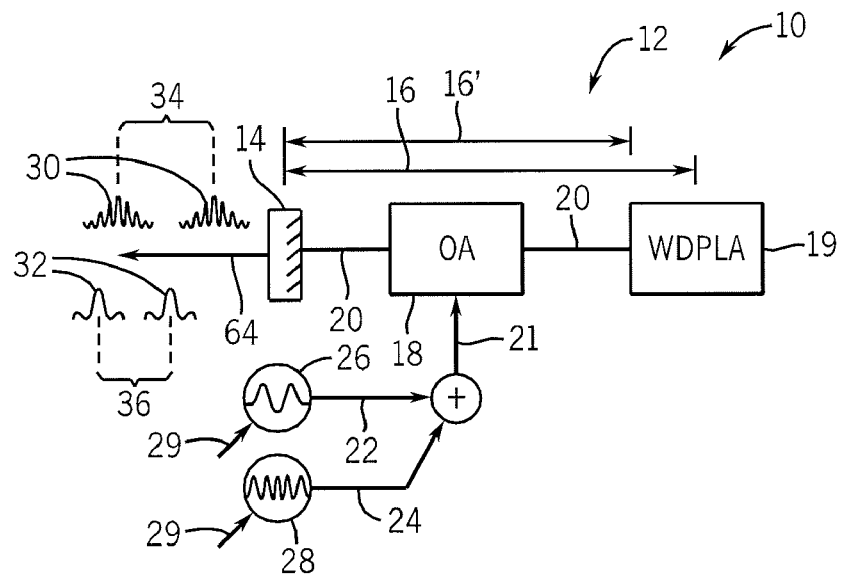
FIG. 1 is a block diagram of the mode-locked laser of the present invention showing a laser cavity defined by a light-wavelength-dependent, path-length adjuster, the cavity containing an optical amplifier driven by two modulating signals.

Referring now to FIG. 1, a mode-locked laser 10 of the present invention provides a laser cavity 12 defined by a distance between a partial mirror 14 and a light-wavelength-dependent, path-length adjuster (WDPLA) 19. The partial mirror 14 may be a partially silvered mirror, a mirror and beam splitter, or other well-known devices operating to extract energy from the cavity 12 while preserving laser resonance within the cavity.

Different effective cavity lengths 16 and 16' (being a product of actual cavity length and light propagation speed) may be obtained simultaneously for different light frequencies in the cavity according to the operation of the WDPLA 19 as will be described below.

An optical amplifier 18 is positioned in the path of light 20 within the cavity 12, preferably at one end of the cavity 12, to amplify the light 20 by stimulated emissions as the light passes through the optical amplifier 18. As is understood in the art, an optical amplifier is a device that may directly amplify optical signals without converting them first to electrical signals. The optical amplifier may be, for example, a doped fiber optical amplifier such as an erbium-doped fiber amplifier (EDFA) or other optical amplifier generally understood in the art. More generally, the optical amplifier may be any modulator, such as an optical switch coupled with some optical gain element.

The optical amplifier 18 may receive an electrical modulation signal 21 controlling the gain of the optical amplifier. In the present invention, the electrical modulation signal 21 is a combination (in this case, the sum) of at least two different periodic signals 22 and 24 produced by waveform generators 26 and 28 respectively. Waveform generators 26 and 28 may be multiple discrete waveform generators or a single generator producing multiple waveforms.

The light-wavelength-dependent cavity 12 potentially supports many different laser modes of different light wavelengths each experiencing different effective cavity lengths 16 and 16'. These multiple modes are culled by the operation of the periodic signals 22 and 24 which define a window of time during which light passing through the optical amplifier 18 will be amplified. By selection of the period of each periodic signal 22 and 24, only modes and frequencies having a round-trip cavity transit time corresponding to a period of one of the periodic signals 22 and 24 are amplified. Thus the periodic signals can control multiple simultaneous modes and multiple near simultaneous light frequencies produced by the laser 10.

For example, periodic signals 22 from waveform generator 26 may provide a relatively longer period corresponding to the round-trip transit time for a short wavelength light pulse 30 experiencing the longer effective path-length 16 from the effect of the WDPLA 19. The selective amplification and the mode-locking of the optical amplifier 18 stimulated by periodic signals 22 thereby provides short wavelength light output pulses 30 at a low repetition rate 34 corresponding generally (for example in harmonic relationship) to the period of periodic signal 22.

Conversely, periodic signals 24 from waveform generator 28 may provide a relatively shorter period corresponding to the round-trip transit time for a long wavelength light pulse 32 experiencing the shorter effective path-length 16 from the effect of the WDPLA 19. The result is long wavelength light output pulses 32 at a higher repetition rate 36 again corresponding generally to the period of periodic signal 24.

Figure 2:
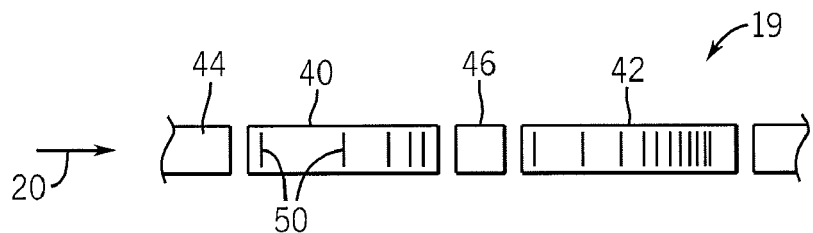
FIG. 2 is a simplified representation of one embodiment of the light-wavelength-dependent, path-length adjuster of FIG. 1 employing two separated chirped fiber Bragg gratings.

Referring now to FIG. 2, in a first embodiment, the WDPLA 19 may be a first chirped fiber Bragg grating (CFBG) 40 and a second CFBG 42 receiving light from an optical fiber 44 communicating to the optical amplifier 18, the CFBG 40 and 42 optionally spaced apart by a spacer fiber 46. Each of the fibers 40, 42, 44, and 46 are joined by low-loss couplers (not shown for clarity). A CFBG, as is understood in the art, has the property of reflecting specific frequencies of light falling within a "bandwidth" of the CFBG, the center of reflection occurring at different positions along the length of the CFBG depending on the frequency of the light. This property is provided by a periodic variation in the index of refraction of the fiber core (shown schematically as lines 50) where the period changes over the length of the CFBG. In this example, the spacing of the variations in index of refraction decreases as one moves within the CFBG away from the optical amplifier 18 causing longer wavelength light received from fiber 44 to reflect near the front of CFBG (being the edge near fiber 44) and shorter wavelength light to reflect near the back of CFBG.

The bandwidths of CFBG 40 and CFBG 42 are preferably non-overlapping to preserve unique cavity lengths for each mode frequency. The CFBG 40 and CFBG 42 may be separated by the spacer fiber 46 as desired to provide a desired separation between the required frequencies of signals 22 and 24 to improve tagging as will be described below. The back of CFBG 42 may connect to a beam dump 52 absorbing any light not reflected by CFBG 40 or CFBG 42.

The CFBG 40 and CFBG 42 thus provide different cavity lengths 16 and 16' for different frequencies of light by changing a point of reflection of the light along the cavity 12 implemented by the fibers. The chirped nature of the CFBG 40 and CFBG 42 also allows a tuning 29 of each light frequency by changing the period of the signals 22 and 24 to select different modes using slightly different reflection points within each of the CFBG 40 and CFBG 42. Thus, a center of the CFBG 40 and CFBG 42 may define a coarse light frequency output by the laser 10 which may then be tuned by adjusting the signals 22 and 24 appropriately within the bandwidths of the CFBG 40 and CFBG 42.

Figure 3:
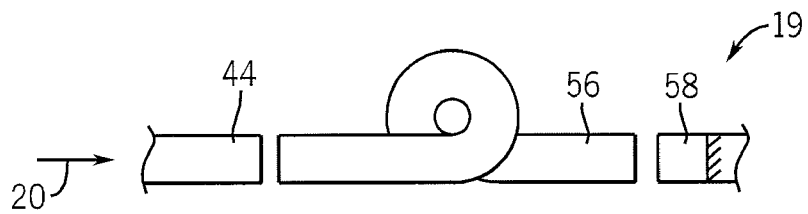
FIG. 3 is figure similar to that of FIG. 2 where the light-wavelength-dependent, path-length adjuster is a high dispersion fiber.

Referring now to FIG. 3, in an alternative embodiment, the CFBGs 40 and 42 and spacer fiber 46 may be replaced by one or more lengths of a high dispersion fiber 56. High dispersion fibers provide different degrees of delay of light passing though the high dispersion fiber as a function of the wavelength of the light providing an effective cavity length change (as manifest in the time of the round-trip travel of the light) serving the same purpose as provided by the CFBG 40 and CFBG 42.

The high dispersion fiber 56 is followed by a fiber mirror 58 reflecting light after passage through the high dispersion fiber 46. Like the embodiment of FIG. 3, the embodiment of FIG. 4 may also allow tuning of the light frequencies produced, by selectively amplifying modes associated with frequencies of light having round trip transit times within the cavity 12 corresponding to the period of one of the signals 22 and 24.

Figure 4:
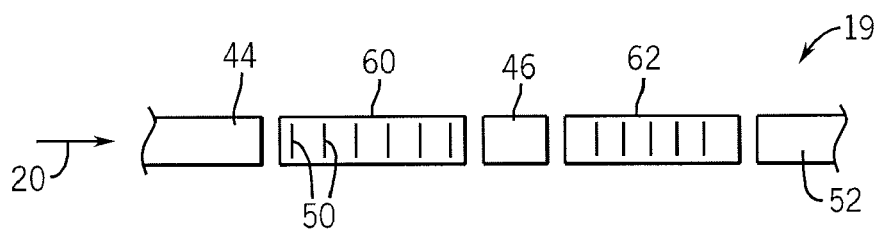
FIG. 4 is a figure similar to that of FIGS. 2 and 3 where the light-wavelength-dependent, path-length adjuster is two separated standard fiber Bragg gratings.

Referring now to FIG. 4, it will be understood that a simpler embodiment, without the possibility of wide range tuning, may be created by replacing CFBGs 40 and 42 with standard (unchirped) fiber Bragg gratings 60 and 62 each providing a reflection of a light within only a narrow bandwidth.

It should be understood that the generation of additional frequencies within cavity 12 beyond the frequencies of pulses 30 and 32, should be possible by use of additional signal generators 26 and appropriate addition of additional CFBGs or FBGs according to these teachings.

Figure 5:
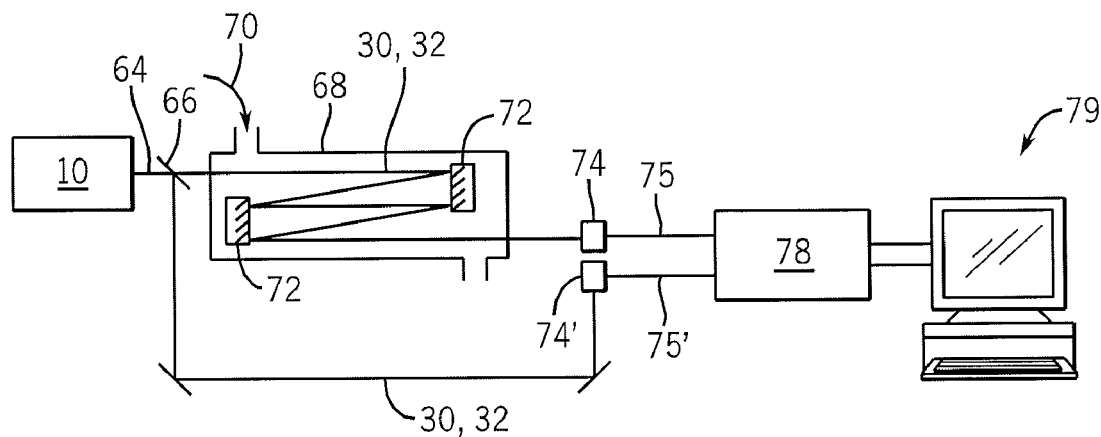
FIG. 5 is a block diagram showing the mode-locked laser of the present invention incorporated into a gas analyzer and employing demodulation circuitry for isolating the intensity of two laser beams according to their modulation frequency.

Referring now to FIG. 5, the laser 10 of the present invention may thus provide an output beam 64 comprised of pulses 30 and 32 of different frequencies. This beam 64 may be received by a beam splitter 66, and one portion of the beam 64 (including pulses 30 and 32) may be directed into a gas-containing chamber 68 which may receive an introduced gas 70, for example, a patient's breath. The beam 64 may thus interact with the gas 70 to be attenuated by partial absorption by gas components, for example, $C_{12}$ and $C_{13}$. The gas-containing chamber 68 may include an optical system 72 increasing the path-length of the beam 64 in the gas 70. Light exiting from the gas-containing chamber 68 may be received by a photodetector 74. A second photodetector 74' (or the same photodetector 74 operating with chopping or optical multiplexing) may also receive a second portion of the beam 64 from the beam splitter 66, this second portion not passing through the gas-containing chamber 68, and thus providing a baseline reference. Two signals 75 and 75' may be derived from the intensities of the beam 63 passing through the gas-containing chamber 68 and bypassing the gas-containing chamber and sent to a de-modulator 78 communicating with a display terminal 79.

Figure 6:
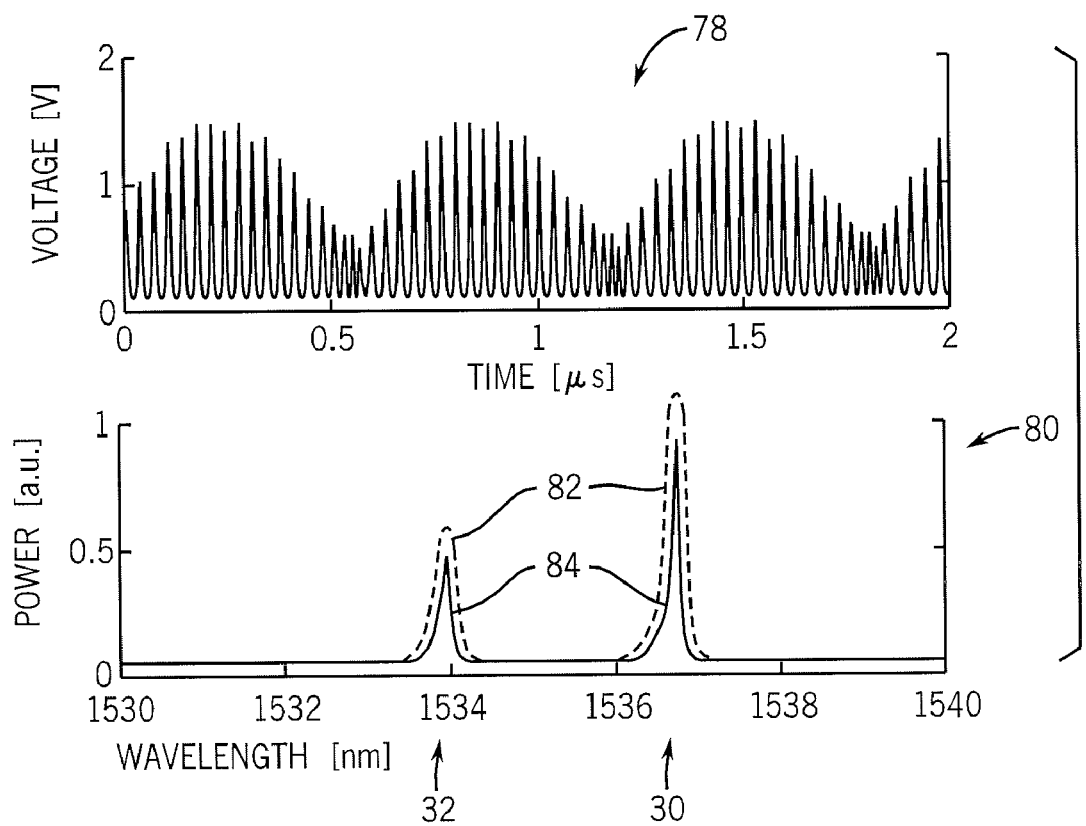
FIG. 6 is a time domain plot of the light output by the mode-locked laser of the present invention and its demodulation into the frequency domain.

Referring now also to FIG. 6, the signal 75 typical of both of the detected signals 75 and 75' shows a beating pattern caused by the constructive interference between the pulses 30 and 32 caused by their different repetition rates 34 and 36, in turn a function of the different periods of signals 22 and 24. The difference in pulse repetition rates 34 and 36 allow individual amplitudes of the intensities of the pulses 30 and 32 to be extracted through the Fourier transform (implemented in a separate circuit or in software within the display terminal 79) acting as a demodulator to produce a spectrum 80 showing the two peaks 82, one representing pulse 32 and one representing pulse 30 as modified by the gas 70 in gas-containing chamber 68. A similar spectrum may be developed for the beam 64 bypassing the gas-containing chamber 68 to reveal two peaks 84 one representing pulse 32 and one representing pulse 30. A comparison of corresponding peaks 82 and 84 clearly indicates the absorption of each different light wavelength of pulses 32 and pulses 30, without the need for optical filters or the like.

EXAMPLE 1

Referring to FIGS. 1 and 4, in a first example, the optical amplifier 18 may be a linear optical amplifier (LOA) incorporating a vertical cavity surface emitting laser (VCSEL), for example the Genoa G111 commercially available from Finisar Corporation of Sunnyvale Calif. (www.finisar.com). Two uniform FBGs 60 and 62 were used having center wavelengths $\lambda_1$=1533.86 nm and $\lambda_2$=1536.53 nm with a full width half maximum (FWHM) equal to 0.41 nm and 0.45 nm respectively. Fiber cavity lengths for these frequencies $\lambda_1$ and $\lambda_2$ were equal to 10.05 m and 10.61 m respectively. All fibers were single mode fibers.

The waveform generators 26 and 28 were a DS345 function generator available from Stanford Research Systems, Inc of Sunnyvale, Calif. (www.thinksrs.com) and an Agilent 33250 available from Agilent Technologies, Inc of Santa Clara, Calif., each configured for sinusoidal modulation with a DC offset value ensuring sufficient energy for laser operation The periodic signals 22 and 24 were set to have frequencies matching the third harmonic of the round-trip frequencies of the pulses 30 and 32 of 30.45 MHz and 28.86 MHz respectively. Measured spectral full width half maximum parameters of each light pulse 30 and 32 were approximately 0.13 nm corresponding to approximately 0.11 nanometers based on the known limiting resolution of the measurement equipment. These measurements are reproduced in FIG. 6. Thus, it can be seen that discrete frequency pulses can be produced, separated by regions of substantially no light output, these regions being at least twice the width of the pulses. Beating of the two output pulses can clearly be seen in the time domain plot at a frequency equal to 1.59 MHz.

EXAMPLE 2

Referring to FIGS. 1 and 2, a single CFBG 40 having a center wavelength of 1546.66 nm and a bandwidth of 0.71 nm was analyzed with respect to tuning. The same optical amplifier 18 described above was driven by a synthesized frequency sweeper commercially available from Hewlett-Packard under the trade designation HP83620A.

The laser was mode-locked to the 27th harmonic of the round-trip frequency of the output beam. The fiber length of the cavity varied from 9.40 m at an excitation frequency of 293.18 MHz to 9.43 m at an excitation frequency of 292.21 MHz. Thus tuning was achieved from approximately 1,546.5-1,047 nm, almost the full bandwidth of the CFBG 40. The line width of the output pulses varied from approximately 0.07-0.11 nm. Correcting for instrument broadening, a line width of approximately 0.04-0.09 nm can be inferred.

It is specifically intended that the present invention not be limited to the embodiments and illustrations contained herein, but include modified forms of those embodiments including portions of the embodiments and combinations of elements of different embodiments as come within the scope of the following claims For example, although the linear cavities have been described, ring cavities may also be used. The optical amplifier serving as a modulator can be combined with a separate fixed gain media and free-space gratings could be used in place of the Bragg gratings in one embodiment.

I claim:
1. A mode-locked laser comprising:
a laser cavity having a length defined by at least one light-wavelength-dependent, path-length adjuster;
an optical modulator positioned within the cavity for modulating the light passing through the cavity as controlled by a modulator input;
at least one signal generator producing multiple output signals to provide the modulator input, where the output signals have different periods related to different round-trip transit times within the laser cavity of light having first and second desired wavelengths, the light of the first and second desired wavelengths experiencing different effective lengths of laser cavity according to the light-wavelength-dependent, path-length adjuster; and wherein the mode-locked laser outputs light at the first and second desired wavelengths modulated at the first and second periods.

2. The mode-locked laser of claim 1 wherein the first and second wavelengths have bandwidths and are separated by regions with substantially no output light at least twice the width of the bandwidths.

3. The mode-locked laser of claim 1 wherein the laser cavity is an optical fiber and the light-wavelength-dependent, path-length adjuster is at least one fiber Bragg grating associated with each of the first and second desired wavelengths and selectively reflecting the light of the first and second desired wavelengths at different positions along the optical fiber.

4. The mode-locked laser of claim 1 wherein the light-wavelength-dependent, path-length adjuster provides a continuous range of path length adjustment for a continuous domain of wavelengths and further including tuning means for changing the period of at least one of the output signals to change the wavelength of the light output from the mode-locked laser.

5. The mode-locked laser of claim 4 wherein the laser cavity is an optical fiber and the light-wavelength-dependent, path-length adjuster is at least one chirped fiber Bragg filter.

6. The mode-locked laser of claim 5 wherein the laser cavity is an optical fiber and the light-wavelength-dependent, path-length adjuster is at least two chirped fiber Bragg filters for each desired wavelength of light selectively reflecting a range of wavelengths of light around the first and second desired wavelengths, the chirped fiber Bragg filters positioned at different positions along the optical fiber.

7. The mode-locked laser of claim 1 further including tuning means for changing the period of at least one of the output signals to change the wavelength of the light output from the mode-locked laser.

8. The mode-locked laser of claim 1 wherein the optical modulator is selected from the group consisting of a semiconductor optical amplifier and a doped fiber optical modulator.

9. A mode-locked laser comprising:
a laser cavity having a length defined by at least one light-wavelength-dependent, path-length adjuster;
an optical modulator positioned within the cavity for modulating the light passing through the cavity as controlled by a modulator input;
at least one signal generator producing multiple output signals to provide the modulator input, where the output signals have different periods related to different round-trip transit times within the laser cavity of light having first and second desired wavelengths, the light of the first and second desired wavelengths experiencing different effective lengths of laser cavity according to the light-wavelength-dependent, path-length adjuster;
wherein the mode-locked laser outputs light at the first and second desired wavelengths modulated at the first and second periods;
further including an optical sensor receiving light output from the mode-locked laser to provide a light amplitude signal combining the amplitude of the light of the first and second desired wavelengths; and
a demodulator extracting an independent amplitude value for each of the first and second wavelengths.

10. The mode-locked laser of claim 9 wherein the demodulator is a Fourier transform device.

11. The mode-locked laser of claim 9 further including a gas-holding chamber positioned in a path of light from the mode-locked laser and before the optical sensor; and
wherein the first and second light wavelengths are centered on first and second absorption bands for gaseous chemical species.

12. The mode-locked laser of claim 1 wherein the different periods of the output signals are harmonic frequencies of the round-trip transit times of the light of the first and second wavelengths in the laser cavity.

13. The mode-locked laser of claim 1 wherein the at least one signal generator produces more than two output signals and wherein the mode-locked laser outputs light at more than two discrete wavelengths.

14. A method of producing at least two wavelengths of light from a mode-locked laser comprising the steps of:
preparing a laser cavity having an effective light path-length dependent on light wavelength; and
modulating light within the laser cavity using an optical modulating modulated by at least two signals having different periods corresponding to different round-trip transit times within the laser cavity of light having a different desired wavelength corresponding to each of the different periods.

15. The method of claim 14 further including the step of tuning at least one wavelength of the light by changing the period of at least one of the first and second signals independently of changing mechanical qualities of the laser cavity.

16. A method of producing at least two wavelengths of light from a mode-locked laser comprising the steps of:
preparing a laser cavity having an effective light path-length dependent on light wavelength;
modulating light within the laser cavity using an optical modulating modulated by at least two signals having different periods corresponding to different round-trip transit times within the laser cavity of light having a different desired wavelength corresponding to each of the different periods;
further including the step of detecting the first and second light wavelengths using an optical detector and isolating an amplitude of the first and second wavelengths by a demodulation according to the different periods of the first and second signals.

17. The method of claim 16 wherein the demodulation applies a Fourier transform to a time domain signal from the optical sensor.

18. The method of claim 16 further including passing the light through a gas filled chamber wherein the first and second light wavelengths are centered on first and second absorption bands for gaseous chemical species.

* * * * *